US012713992B2

(12) United States Patent
Wu et al.

(10) Patent No.: US 12,713,992 B2
(45) Date of Patent: Aug. 18, 2026

(54) SEMICONDUCTOR DIE PACKAGE AND METHODS OF MANUFACTURING

(71) Applicant: Taiwan Semiconductor Manufacturing Company, Ltd., Hsinchu (TW)

(72) Inventors: Chih-Wei Wu, Zhuangwei Township (TW); An-Jhih Su, Taoyuan City (TW); Hua-Wei Tseng, New Taipei City (TW); Ying-Ching Shih, Hsinchu City (TW); Wen-Chih Chiou, Zhunan Township (TW); Chun-Wei Chen, New Taipei City (TW); Ming Shih Yeh, Zhubei City (TW); Wei-Cheng Wu, Hsinchu City (TW); Der-Chyang Yeh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 462 days.

(21) Appl. No.: 18/308,032

(22) Filed: Apr. 27, 2023

(65) Prior Publication Data

US 2024/0128211 A1 Apr. 18, 2024

Related U.S. Application Data

(60) Provisional application No. 63/379,489, filed on Oct. 14, 2022.

(51) Int. Cl.

| | |
|---|---|
| ***H10W 90/00*** | (2026.01) |
| ***H10W 70/60*** | (2026.01) |
| ***H10W 70/65*** | (2026.01) |
| *H10W 72/00* | (2026.01) |
| *H10W 72/20* | (2026.01) |
| *H10W 72/90* | (2026.01) |

(52) U.S. Cl.

CPC ........ *H10W 90/701* (2026.01); *H10W 70/611* (2026.01); *H10W 70/65* (2026.01);

(Continued)

(58) Field of Classification Search

CPC ......... H01L 23/49816; H01L 23/49833; H01L 23/49838; H01L 24/05; H10W 90/701; H10W 90/401; H10W 70/611

See application file for complete search history.

(56) References Cited

U.S. PATENT DOCUMENTS 9,793,246 B1 * 10/2017 Tseng .................... H10W 70/09
9,899,355 B2 2/2018 Yuan et al.

(Continued)

FOREIGN PATENT DOCUMENTS

TW 201712836 A 4/2017
TW 201743427 A 12/2017

(Continued)

*Primary Examiner* — Dale E Page
*Assistant Examiner* — Wilner Jean Baptiste
(74) *Attorney, Agent, or Firm* — Harrity & Harrity, LLP

(57) ABSTRACT

Some implementations described herein provide techniques and apparatuses for a stacked semiconductor die package. The stacked semiconductor die package may include an upper semiconductor die package above a lower semiconductor die package. The stacked semiconductor die package includes one or more rows of pad structures located within a footprint of a semiconductor die of the lower semiconductor die package. The one or more rows of pad structures may be used to mount the upper semiconductor die package above the lower semiconductor die package. Relative to another stacked semiconductor die package including a row of dummy connection structures adjacent to the semiconductor die that may be used to mount the upper semiconductor die package, a size of the stacked semiconductor die package may be reduced.

20 Claims, 17 Drawing Sheets

(52) U.S. Cl.
CPC ......... *H10W 72/923* (2026.01); *H10W 90/00* (2026.01); *H10W 90/401* (2026.01); *H10W 70/60* (2026.01); *H10W 72/01935* (2026.01); *H10W 72/01951* (2026.01); *H10W 72/07252* (2026.01); *H10W 72/07341* (2026.01); *H10W 72/221* (2026.01); *H10W 72/921* (2026.01); *H10W 72/952* (2026.01); *H10W 90/722* (2026.01); *H10W 90/724* (2026.01); *H10W 90/734* (2026.01); *H10W 90/794* (2026.01)

(56) References Cited

U.S. PATENT DOCUMENTS

| | | | | |
|---|---|---|---|---|
| 10,529,650 | B2 | 1/2020 | Chen et al. | |
| 10,784,247 | B2 | 9/2020 | Chen et al. | |
| 11,062,968 | B2 | 7/2021 | Chen et al. | |
| 11,393,783 | B2 * | 7/2022 | Cheng ................. | H10W 70/093 |
| 11,854,955 | B2 | 12/2023 | Tsai et al. | |
| 2015/0311169 | A1 | 10/2015 | Chuang et al. | |
| 2017/0229414 | A1 * | 8/2017 | Cheng ................. | H10W 70/093 |
| 2019/0057946 | A1 | 2/2019 | Chuang et al. | |
| 2019/0326273 | A1 | 10/2019 | Bhagavat et al. | |
| 2021/0050300 | A1 * | 2/2021 | Lin .................... | H03K 19/1776 |
| 2021/0327866 | A1 | 10/2021 | Yu et al. | |

FOREIGN PATENT DOCUMENTS

| | | | |
|---|---|---|---|
| TW | 201923866 | A | 6/2019 |
| TW | 201923914 | A | 6/2019 |
| TW | 202002227 | A | 1/2020 |
| TW | 202109830 | A | 3/2021 |

* cited by examiner 200
202
204
206
208
210
212
214
216
218
220
222
224
226
228
230
232
234
236
238
240
242
244
246
248
250
252
254

SEMICONDUCTOR DIE PACKAGE AND METHODS OF MANUFACTURING

CROSS-REFERENCE TO RELATED APPLICATION

This Patent application claims priority to Provisional Patent Application No. 63/379,489, filed on Oct. 14, 2022, and entitled "Semiconductor Die Package and Methods of Manufacturing." The disclosure of the prior Application is considered part of and is incorporated by reference into this Patent Application.

BACKGROUND

Various semiconductor device packing techniques may be used to incorporate one or more semiconductor dies into a semiconductor die package. Semiconductor device packaging techniques that may be performed to incorporate one or more semiconductor dies into a semiconductor die package may include package-on-package (PoP) packaging technique, a chip on wafer (CoW) packaging technique, an integrated fanout (InFO) packaging technique, a multi-chip package (MCP) packaging technique, a wafer-on-wafer (WoW) packaging technique, and/or chip-on-wafer-on-substrate (CoWoS) packaging technique, among other examples. In some cases, semiconductor dies may be stacked in a semiconductor die package to achieve a smaller horizontal or lateral footprint of the semiconductor die package and/or to increase the density of the semiconductor die package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
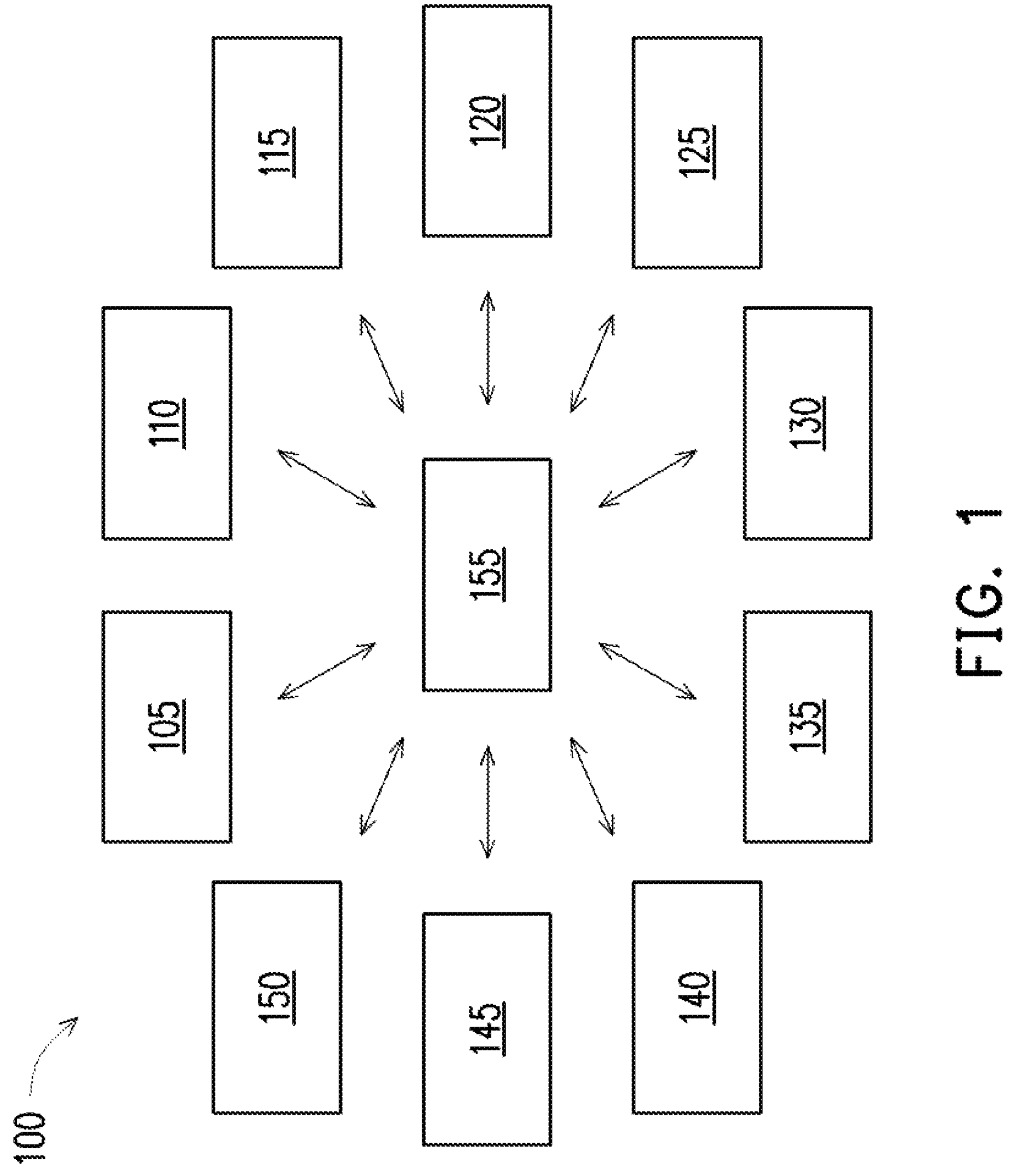
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a stacked semiconductor die package may include a lower semiconductor die package that includes or more integrated circuit (IC) dies, or chips, from a semiconductor wafer, such as a system-on-chip (SoC) IC die and a power management unit (PMU) IC die. The SoC IC die and the PMU die may be mounted to an interconnection structure corresponding to an integrated fan-out (InFO) interconnection structure. The stacked semiconductor die package may further include an upper semiconductor die package, such as a multi-chip semiconductor die package (MCP), that is connected to the lower semiconductor die package.

In some implementations, the interconnection structure includes one or more rows of dummy connection structures (e.g., connection structures that do not transmit electrical signals) to mount the upper semiconductor die package to the lower semiconductor die package and/or the interconnection structure. In some implementations, the one or more rows of dummy connection structures may correspond to through InFO via (TIV) dummy connection structures.

The one or more rows of dummy connection structures may be outside a perimeter of an IC die included in the lower semiconductor die package (e.g., the PMU IC die and/or the SoC IC die, among other examples). The presence of the one or more rows of dummy connection structures outside the perimeter of the IC die may consume space within the semiconductor die package and increase an overall size of the stacked semiconductor die package.

Some implementations described herein provide techniques and apparatuses for a stacked semiconductor die package. The stacked semiconductor die package may include an upper semiconductor die package above a lower semiconductor die package. The stacked semiconductor die package includes one or more rows of pad structures located within a footprint of an IC die of the lower semiconductor die package. The one or more rows of pad structures may be used to mount the upper semiconductor die package above the lower semiconductor die package. Relative to another stacked semiconductor die package including a row of dummy connection structures adjacent to the IC die that may be used to mount the upper semiconductor die package, a size of the stacked semiconductor die package may be reduced.

In this way, an amount of resources may be reduced when fabricating a volume of the stacked semiconductor die package. For example, an amount of raw materials, an amount of manufacturing tools, and an amount of supporting computing resources may be lesser for a manufacturing line fabricating the stacked semiconductor die package including the one or more rows of pad structures than for a manufacturing line fabricating the stacked semiconductor die package including the one or more rows of dummy connection structures.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor die package or a state of completion of the semiconductor die package.

One or more of the semiconductor processing tool sets 105-150 may perform a combination of operations to assemble a semiconductor die package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor die package (e.g., test and sort the one or more IC dies, and/or the semiconductor die package, at various stages of manufacturing).

The semiconductor die package may correspond to a type of semiconductor die package. For example, the semiconductor die package may correspond to a flipchip (FC) type of semiconductor die package, a ball grid array (BGA) type of semiconductor die package, a multi-chip package (MCP) type of semiconductor die package, or a chip scale package (CSP) type of semiconductor die package. Additionally, or alternatively, the semiconductor die package may correspond to a plastic leadless chip carrier (PLCC) type of semiconductor die package, a system-in-package (SIP) type of semiconductor die package, a ceramic leadless chip carrier (CLCC) type of semiconductor die package, or a thin small outline package (TSOP) type of semiconductor die package, among other examples.

The RDL tool set 105 includes one or more tools capable of forming one or more layers and patterns of materials (e.g., dielectric layers, conductive redistribution layers, and/or vertical interconnect access connection structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, a spin coating tool, or a plating tool, among other examples). The RDL tool set 105 may further include a wafer bonding/debonding tool. In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor die package. The connection structures formed by the connection tool set 115 may include a wire, a stud, a pillar, a bump, or a solder ball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor die package (e.g., the one or more IC dies after encapsulation). The ATE tool set 120 may perform wafer testing operations, known good die (KGD) testing operations, semiconductor die package testing operations, or system-level (e.g., a circuit board populated with one or more semiconductor die packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor die package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor die package from a leadframe. Additionally, or alternatively, the singulation tool set 125 may include a router tool or a laser tool that removes the semiconductor die package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies or the semiconductor die package to the interposer, the leadframe, a dicing tape, and/or the strip of the organic substrate material, among other examples. The die-attach tool set 130 may include a pick-and-place tool, a taping tool, a reflow tool (e.g., a furnace), a laser tool, a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor die package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor die package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tool sets 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film-frame carrier, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 2A-6, among other examples. The one or more operations include forming a seed layer on a release film layer. The one or more operations include forming a pad structure on the seed layer. The one or more operations include forming a pillar structure on the seed layer. The one or more operations include removing portions of the seed layer that are not covered by the pad structure and the pillar structure. The one or more operations include placing a first IC die over the pad structure such that the pad structure is submerged in a conformal bonding film layer. The one or more operations include placing a second IC die on the release film layer between the pad structure and the pillar structure using a bonding film layer.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
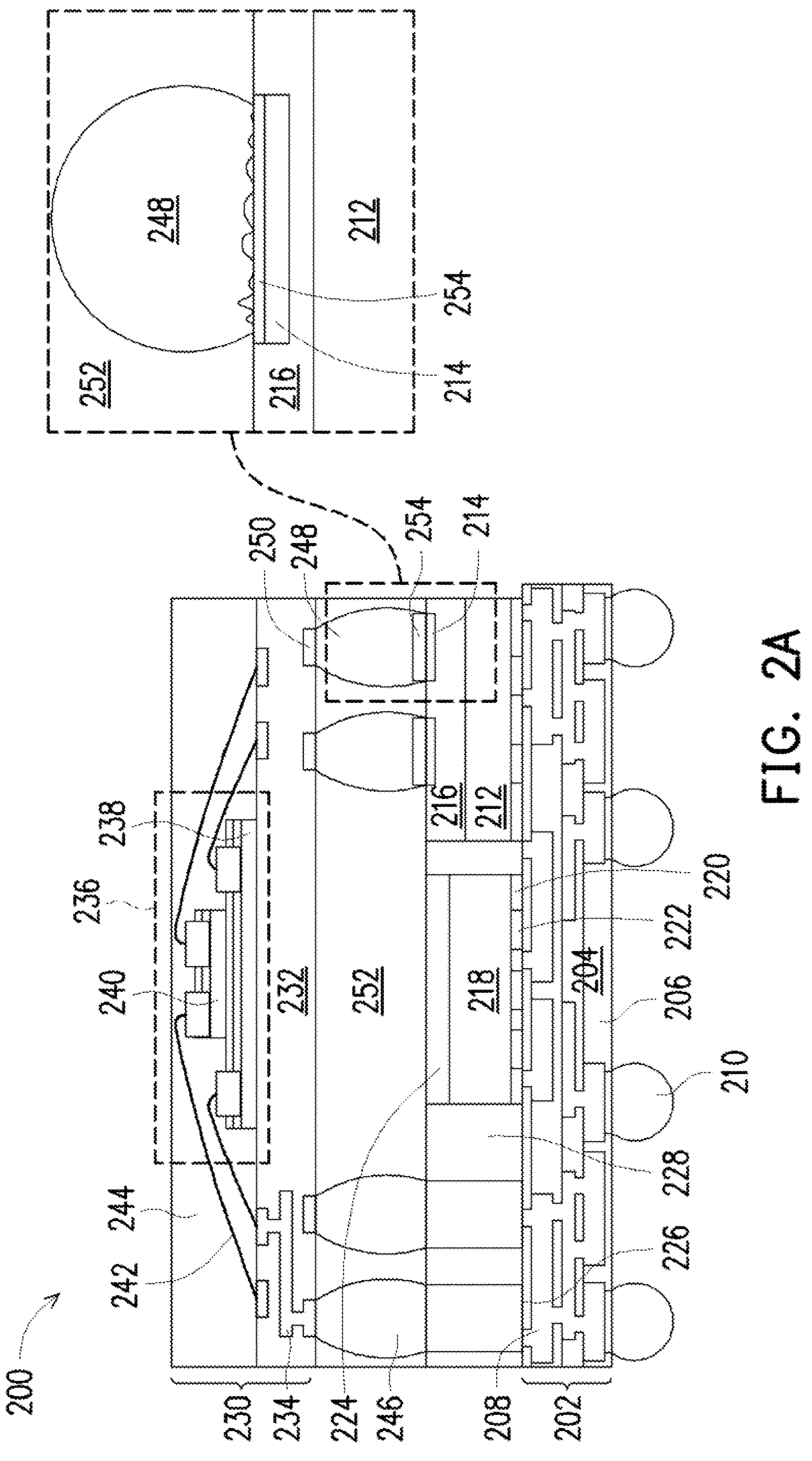
FIGS. 2A and 2B are diagrams of an example semiconductor die package described herein.
Figure 2B:
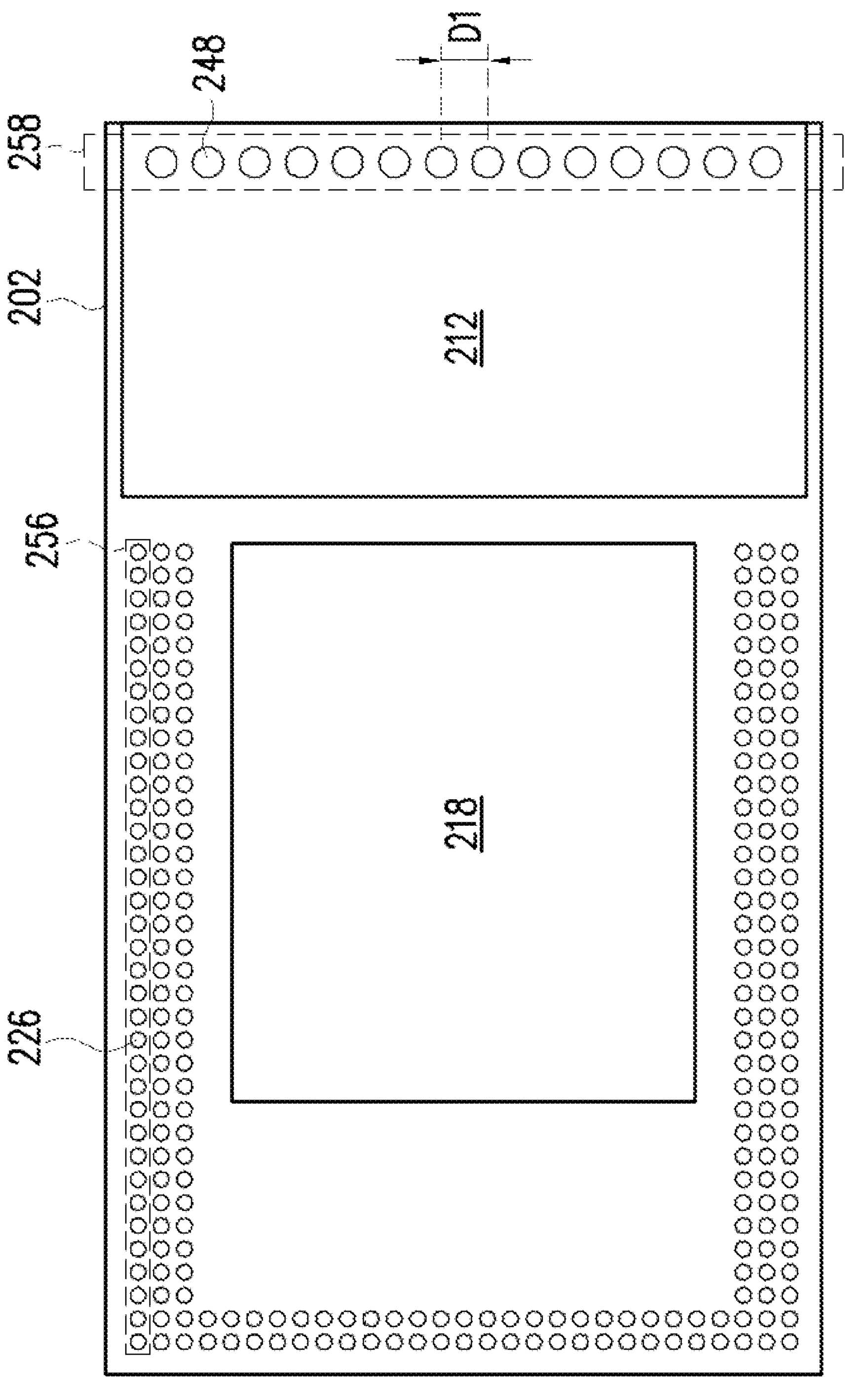

FIGS. 2A and 2B are diagrams of an example semiconductor die package 200 described herein. In some implementations, the semiconductor die package 200 corresponds to a stacked semiconductor die package. One or more portions of the semiconductor die package 200 may be manufactured using one or more of the semiconductor processing tool sets 105-150 of the environment 100 as described in connection with FIG. 1A. Additionally, or alternatively, one or more portions of the semiconductor die package 200 may be fabricated in another environment, such as a semiconductor wafer fabrication facility.

A shown in the side view of FIG. 2A, the semiconductor die package 200 includes an interconnection structure 202) (e.g., a lower substrate). As an example, in some implementations the interconnection structure 202 includes a redistribution layer (RDL) structure 204 including layers of dielectric material 206 (e.g., a polyimide (PO) material, among other examples) and an electrically conductive trace 208 (or a plurality of the electrically conductive traces 208). The electrically conductive trace may include an electrically-conductive material such as a gold (Au) material, a copper (Cu) material, a silver (Ag) material, a nickel (Ni) material, a tin (Sn) material, or a palladium (Pd) material, among other examples. In some embodiments, the interconnection structure 202 includes conductive traces in a silicon substrate.

The interconnection structure 202 may include different types of structures for routing or redistributing electrically conductive traces used for signaling. For example, the interconnection structure 202 may correspond to an integrated fan out (InFO) type of structure. Additionally, or alternatively, the interconnection structure 202 may correspond to a multi-layer printed circuit board (PCB) type of structure. Additionally, or alternatively, the interconnection structure 202 may correspond to a redistribution layer (RDL) type of structure. In some implementations, a connection structure 210 (or multiples of the connection structure 210) may be attached to the interconnection structure 202.

The semiconductor die package 200 includes an integrated circuit (IC) die 212 above the interconnection structure 202. In some implementations, the IC die 212 corresponds to a power management unit integrated circuit (PMU IC) die. Additionally, or alternatively and in some implementations, the IC die 212 corresponds to a semiconductor die package.

In some implementations, a pad structure 214 is above the IC die 212. The pad structure 214 may include, for example, a copper (Cu) material and/or a nickel (Ni) material, among other examples. As shown in FIG. 2A, a bonding film layer 216 is between the IC die 212 and the pad structure 214. The bonding film layer 216 may correspond to a non-conductive, film-over-wire layer (FOW layer) including b-stage type of a bonding material. In some implementations, the bonding film layer 216 electrically isolates the pad structure 214 from the IC die 212.

Additionally, or alternatively, the semiconductor die package 200 includes an IC die 218 above the interconnection structure 202 and adjacent to the IC die 212. In some implementations, the IC die 218 corresponds to a system-on-chip integrated circuit (SoC IC) die. Additionally, or alternatively and in some implementations, the IC die 218 corresponds to a semiconductor die package.

In some implementations and as shown in FIG. 2A, a layer of polyimide material 220 is between the IC die 218 (and/or the IC die 212) and the interconnection structure 202. In such implementations, a pad structure 222 (e.g., a conductive pad structure) may further be included in the semiconductor die package 200 to connect the IC die 218 (and/or the IC die 212) to the electrically conductive trace 208.

As shown in FIG. 2A, a bonding film layer 224 may be on or over the IC die 218. The bonding film layer 224 may correspond to a non-conductive, die attach film (DAF) material including a b-stage type of flat film.

The semiconductor die package 200 includes a connection structure 226 (or a plurality of the connection structures 226). In some implementations, the connection structure 226 corresponds to a pillar structure. Additionally, or alternatively and in some implementations, the connection structure corresponds to a through InFO vertical interconnect access (TIV) structure. The connection structure 226 may include a conductive material such as a gold (Au) material, a copper (Cu) material, a silver (Ag) material, a nickel (Ni) material, a tin (Sn) material, a lead (Pb) material, a palladium (Pd) material, or a tungsten (W) material, among other examples.

In some implementations, the semiconductor die package 200 includes a mold compound 228 that surrounds and/or encapsulates the IC die 212, the IC die 218, and/or the connection structure 226. The mold compound 228 may include a plastic material and/or an epoxy material, among other examples. The mold compound 228 may protect the IC die 212, the IC die 218, and/or the connection structure 226 during manufacturing of the semiconductor die package 200 or during a field use of the semiconductor die package 200.

The semiconductor die package 200 includes a semiconductor die package 230 above the interconnection structure 202 (e.g., an upper semiconductor die package). In some implementations, the semiconductor die package 230 corresponds to a multi-chip package (MCP). The semiconductor die package 230 includes an interconnection structure 232. In some implementations, and as an example, the interconnection structure 232 corresponds to a printed circuit board (PCB) including a glass-reinforced epoxy laminate material and an electrically conductive trace 234. The electrically conductive trace 234 may include an electrically-conductive material such as a gold (Au) material, a copper (Cu) material, a silver (Ag) material, a nickel (Ni) material, a tin (Sn) material, or a palladium (Pd) material, among other examples.

In some implementations, and as shown in FIG. 2A, the semiconductor die package 230 includes multiple IC dies 236 (e.g., a combination of a logic IC die 238, a dynamic random access memory (DRAM) IC die 240, and or another IC die, among other examples). The semiconductor die package 230 includes a wirebond 242 (or multiples of the wirebond 242). At least one of the multiple IC dies 236 may connect to the electrically conductive trace 234 using the wirebond 242. The wirebond 242 may include an electrically-conductive material such as a (Au) material, a copper (Cu) material, a silver (Ag) material, a nickel (Ni) material, a tin (Sn) material, or a palladium (Pd) material, among other examples.

A mold compound 244 may surround and/or encapsulate the multiple IC dies 236 and/or the wirebond 242. The mold compound 244 may include a plastic material and/or an epoxy material, among other examples. The mold compound 244 may protect the multiple IC dies 236 and/or the wirebond 242 during manufacturing of the semiconductor die package 200 or during a field use of the semiconductor die package 200.

The semiconductor die package 200 may include additional connection structures. For example, the semiconductor die package 200 may include a connection structure 246 between the connection structure 226 and the electrically conductive trace 234. Additionally, or alternatively, the semiconductor die package 200 may include a connection structure 248 between the pad structure 214 and a pad structure 250. In some implementations, the connection structure 246 and/or the connection structure 248 may correspond to a solder connection structure, a solder ball connection structure, a bump connection structure, a stud connection structure, or a pillar connection structure, among other examples. Additionally, or alternatively, the connection structure 246 and/or the connection structure 248 may include an electrically-conductive material such as a gold (Au) material, a copper (Cu) material, a silver (Ag) material, a nickel (Ni) material, a tin (Sn) material, or a palladium (Pd) material, among other examples.

In some implementations, the connection structure 246 (in combination with the connection structure 226) may connect the electrically conductive trace 234 to the electrically conductive trace 208 so that at least one of the multiple IC dies 236 transmits or receives a signal to, or from, the IC die 218 and/or the IC die 212. In some implementations, the connection structure 248 connects the pad structure 250 and the pad structure 214 mechanically (e.g., as a standoff or mechanical connection without a signaling capability, among other examples). As described in greater detail in connection with FIG. 2B, and in contrast to another configuration where the connection structure 248 connects to another pad structure adjacent to an outer edge of the IC die 212 (not shown in FIG. 2A), the connection structure 248 may be within a perimeter of the IC die 212 to reduce a size or footprint of the semiconductor die package 200. By reducing the size or footprint of the semiconductor die package 200, an amount of raw materials, an amount of manufacturing tools, and/or an amount of supporting computing resources may be reduced for a manufacturing line fabricating the semiconductor die package 200.

In some implementations, an underfill material 252 may envelop and/or surround the connection structures 246 and 248. The underfill material 252 may include an epoxy polymer material, among other examples. The underfill material 252 may increase a mechanical robustness of connections between the connection structure 248 and the pad structures 214 and 250. Additionally, or alternatively, the underfill material 252 may increase a mechanical robustness of a connection between the connection structure 246 and the connection structure 226. Additionally, or alternatively, the underfill material 252 may increase a mechanical robustness of a connection between the connection structure 246 and the electrically conductive trace 234.

In an example configuration of the semiconductor die package 200, and as shown in FIG. 2A, the connection structure 226 is adjacent to an edge of the IC die 218. Additionally, or alternatively, the connection structure 226 is adjacent to an edge of the IC die 212. Additionally, or alternatively, the IC die 218 is between the connection structure 226 and the IC die 212.

The magnified view in the upper right portion of FIG. 2A shows additional details related to the pad structure 214. As described in greater detail in connection with FIGS. 3A-3I, and elsewhere herein, a seed layer 254 may be over the pad structure 214. The seed layer 254 may include, for example, a titanium-copper (TiCu) material, among other examples. In some implementations, a top surface of the seed layer 254 is coplanar with a top surface of the bonding film layer 216. Additionally, or alternatively and as shown in the magnified view, the pad structure 214 is enveloped (e.g., submerged or covered) by the bonding film layer 216. Additionally, or alternatively, the bonding film layer 216 is between the pad structure 214 and the IC die 212 to electrically isolate the pad structure 214 from the IC die 212.

In some implementations, formation of the pad structure 214 includes forming a mask layer over the seed layer 254. In such implementations, the mask layer has openings exposing the seed layer 254. The pad structure 214 may be plated through openings of the mask layer, and the mask layer may be subsequently removed.

FIG. 2B shows a top view of the semiconductor die package 200, including the IC die 212 and the IC die 218. As shown in the top view of FIG. 2B, the semiconductor die package 200 includes a row 256 including the connection structure 226 (e.g., a row including multiples of the connection structure 226). The row 256 is outside a perimeter of the IC die 212, outside a perimeter of the IC die 218, and inside a perimeter of the interconnection structure 202. Additionally, or alternatively and as shown in the top view of the semiconductor die package 200, the semiconductor die package 200 includes a row 258 including the connection structure 248 (e.g., a row including multiples of the connection structure 248). The row 258 is outside a perimeter of the IC die 218, inside a perimeter of the IC die 212, and inside a perimeter of the interconnection structure 202.

As shown in FIG. 2B, a pitch D1 (e.g., spacing between connection structures (e.g., solder connection structures) and/or pad structures) in the row 258 may be included in a range of approximately 80 microns (μm) to approximately 400 μm. However, other values and ranges for the pitch D1 are within the scope of the present disclosure.

In connection with details described in FIGS. 2A and 2B, a device may have different implementations. In one example implementation, a device (e.g., the semiconductor die package 200) includes a first interconnection structure (e.g., the interconnection structure 202) including a redistribution layer structure 204 including a first electrically conductive trace (e.g., the electrically conductive trace 208). The device includes an IC die 212 above the first interconnection structure. The device includes a first pad structure (e.g., the pad structure 214) above a top surface of the IC die 212. The device includes a bonding film layer (e.g., the bonding film layer 216) between the first pad structure and the top surface of the IC die 212, where the bonding film layer electrically insulates the first pad structure from the IC die 212. The device includes a first connection structure (e.g., the connection structure 226) adjacent to an edge of the IC die 212, where the first connection structure connects to the first electrically conductive trace. The device includes a semiconductor die package 230 above the first interconnection structure. The semiconductor die package 230 includes a second interconnection structure 232. The second interconnection structure 232 includes a second electrically conductive trace (e.g., the electrically conductive trace 234), where the second electrically conductive trace connects to the first electrically conductive trace through the first connection structure. The semiconductor die package 230 includes a second pad structure (e.g., the pad structure 250) connected to the first pad structure through a second connection structure (e.g., the connection structure 248).

Additionally, or alternatively and in another example implementation, a semiconductor die package 200 includes a lower substrate (e.g., the interconnection structure 202). The semiconductor die package 200 includes a first IC die (e.g., the IC die 212) connected to the lower substrate. The semiconductor die package 200 includes a second IC die (e.g., the IC die 218) connected to the lower substrate adjacent to the first IC die. The semiconductor die package 200 includes an upper substrate (e.g., the interconnection structure 232) above the first IC die and above the second IC die. The semiconductor die package 200 includes a first row (e.g., the row 256) of first connection structures (e.g., connection structures including the connection structure 226) outside a first top-view perimeter of the first IC die, outside a second top-view perimeter of the second IC die, and inside a third top-view perimeter of the lower substrate, where the first connection structure is between electrically conductive traces of the lower substrate (e.g., electrically conductive traces including the electrically conductive trace 208) and electrically conductive traces of the upper substrate (e.g., electrically conductive traces including the electrically conductive trace 234). The semiconductor die package 200 includes a second row (e.g., the row 256) of second connection structures (e.g., connection structures including the connection structure 248) inside the second top-view perimeter of the second IC die, inside the third top-view perimeter of the lower substrate, and outside the first top-view perimeter of the first IC die, where the second connection structure is between a row of electrically-isolated pad structures (e.g., electrically-isolated pad structures including the pad structure 214) above an upper surface of the second IC die and pad structures of the upper substrate (pad structures including the pad structure 250).

As indicated above, FIGS. 2A and 2B are provided as one or more examples. Other examples may differ from what is described with regard to FIGS. 2A and 2B. Additionally, or alternatively, there may be additional feature, different features, or differently arranged features in the semiconductor die package 200 than those shown in FIGS. 2A and 2B.

3A-3I are diagrams of an example manufacturing process 300 used to manufacture the semiconductor die package 200 described herein. The manufacturing process 300 may use one or more of the semiconductor processing tool sets 105-150 as described in connection with FIG. 1. Additionally, or alternatively, the manufacturing process 300 may use one or more similar semiconductor manufacturing tools located in a semiconductor wafer fabrication facility (e.g., tools similar to the RDL tool set 105, among other examples).

Figure 3A:
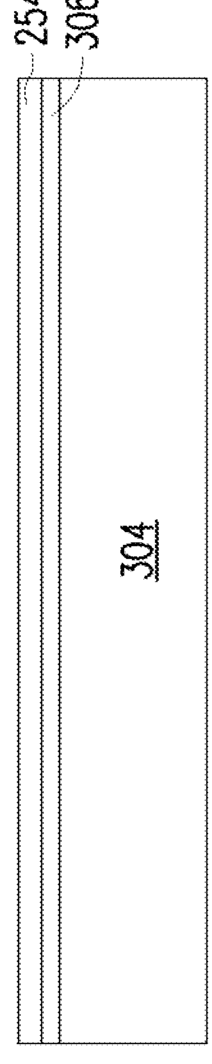
FIGS. 3A-3I are diagrams of an example manufacturing process used to manufacture the semiconductor die package described herein.

As shown in FIG. 3A, and as part of a series of operations 302, a temporary carrier 304 (e.g., a glass substrate or a ceramic substrate, among other examples) may be coated with a release film layer 306. The release film layer 306, which may correspond to light-to-heat conversion (LTHC) release film layer, may be deposited on the temporary carrier 304 by a deposition tool of the RDL tool set 105 (e.g., the spin coat tool, among other examples). Furthermore, as part of the series of operations 302, the seed layer 254 is deposited on the release film layer 306. The seed layer 254 may be deposited on the release film layer 306 using a deposition tool of the RDL tool set 105 (e.g., the ALD tool, among other examples).

Figure 3B:
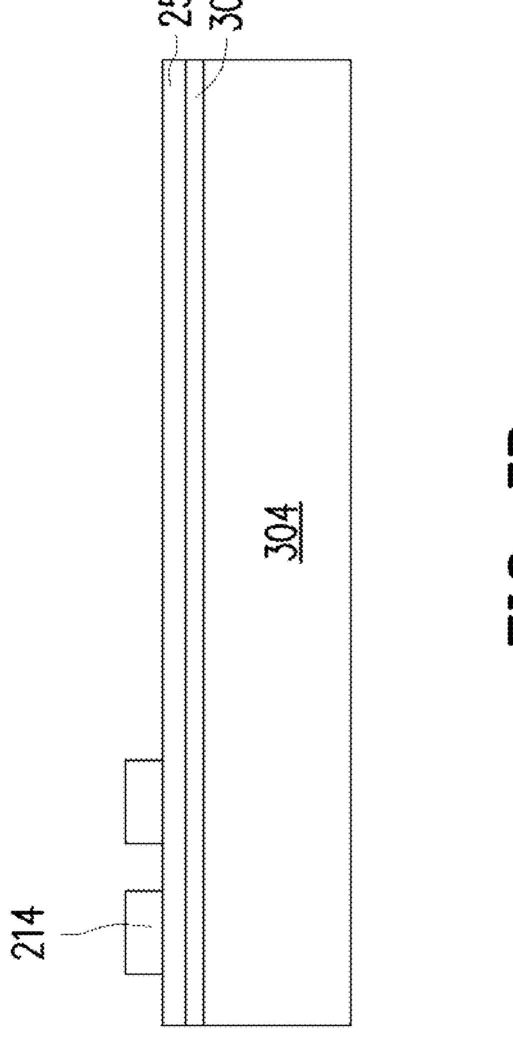

As shown in FIG. 3B, and as part of a series of operations 308, the pad structure 214 (e.g., or multiples of the pad structure 214) may be formed on the seed layer 254. For example, and as part of the series of operations 308, a deposition tool of the RDL tool set 105 (e.g., the plating tool, among other examples) may deposit a layer of a material (e.g., a layer of a copper (Cu) material, among other examples) on the seed layer 254. Additionally, or alternatively and as part of the series of operations 308, tools of the RDL tool set 105 (e.g., the photolithography exposure tool, the photoresist dispense tool, the photoresist develop tool, and/or the dry etch tool, among other examples) may perform patterning and etching operations to form the pad structure 214 from the deposited layer of material.

Figure 3C:
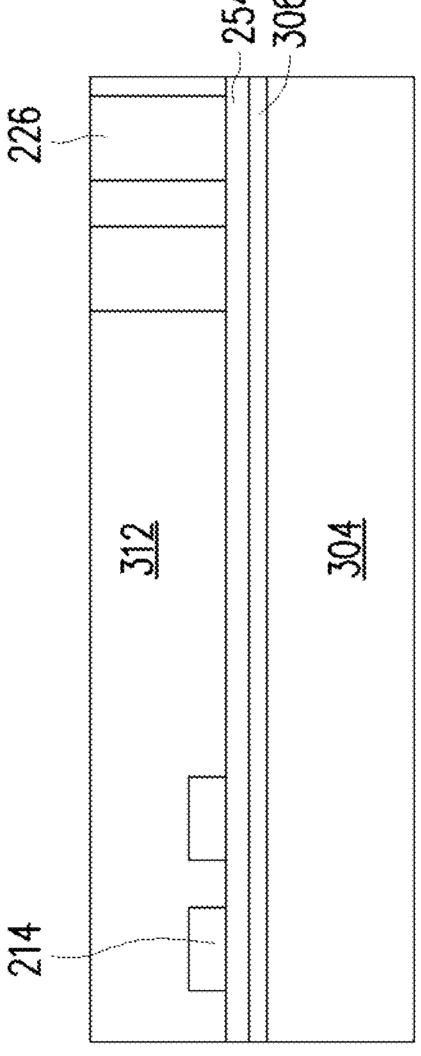

As shown in FIG. 3C, and as part of a series of operations 310, the connection structure 226 (e.g., or multiples of the connection structure 226) may be formed on the seed layer 254. For example, and as part of the series of operations 310, a deposition tool of the RDL tool set 105 (e.g., the CVD tool, among other examples) may deposit a masking layer 312 (e.g., a layer of a silicon dioxide ($SiO_2$) material, among other examples) on the seed layer 254 and over the pad structure 214. Additionally, or alternatively and as part of the series of operations 310, tools of the RDL tool set 105 (e.g., the photolithography exposure tool, the photoresist dispense tool, the photoresist develop tool, and/or the dry etch tool, among other examples) may perform patterning and etching operations to form a cavity in the masking layer 312. Additionally, or alternatively and as part of the series of operations, a deposition tool of the RDL tool set 105 (e.g., the plating tool, among other examples) may deposit a layer of a conductive material (e.g., layer of a copper (Cu) material or a layer of a tungsten (W) material, among other examples) in the cavity and on the masking layer 312. Additionally, or alternatively and as part of the series of operations 310, a tool of the planarization tool set 110 (e.g., the CMP tool, among other examples) may planarize and/or remove portions of the layer of conductive material.

Figure 3D:
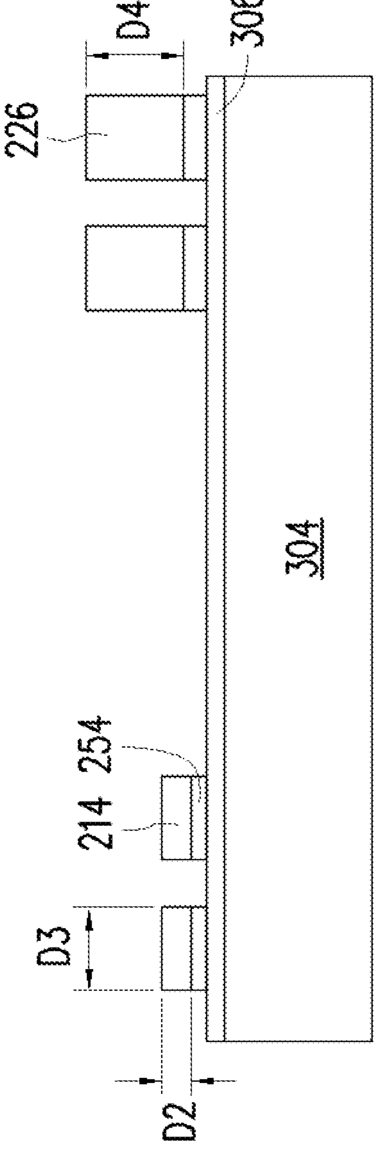

As shown in FIG. 3D, and as part of a series of operations 314, a tool of the RDL tool (e.g., the wet-etch tool, among other examples) may perform a stripping operation to reveal the pad structure 214 and the connection structure 226 (e.g., remove the masking layer 312 using a heated acid bath, among other examples). In some implementations, and as shown in FIG. 3D, a height D2 of the pad structure 214 may be included in a range of approximately 5 μm to approximately 50 μm. If the height D2 is less than approximately 5 μm, a connection structure (e.g., the connection structure 248) may overlap the pad structure 214 and interfere with a conformal bonding film layer (e.g., the bonding film layer 216) to increase a risk of damage to the conformal bonding film layer (e.g., cracking, among other examples). If the height D2 is greater than approximately 300 μm, a risk of cold solder joint issues between the pad structure 214 and the connection structure may increase. However, other values and ranges for the height D2 are within the scope of the present disclosure.

Additionally, or alternatively, a width D3 of the pad structure 214 may be include in a range of approximately 50 μm to approximately 300 μm. If the width D3 is less than approximately 50 μm, an area of the pad structure 214 may be insufficient to form a reliable solder joint with a connection structure (e.g., the connections structure 248). If the width is greater than approximately 300 μm, a pitch or spacing with an adjacent pad structure (and a size of the stacked semiconductor die package 200) may increase to avoid a risk of bridging between adjacent connection structures. However, other values and ranges for width D3 are within the scope of the present disclosure.

Additionally, or alternatively and as shown in FIG. 3D, the height D2 of the pad structure may be lesser relative to a height D4 of the connection structure 226.

Figure 3E:
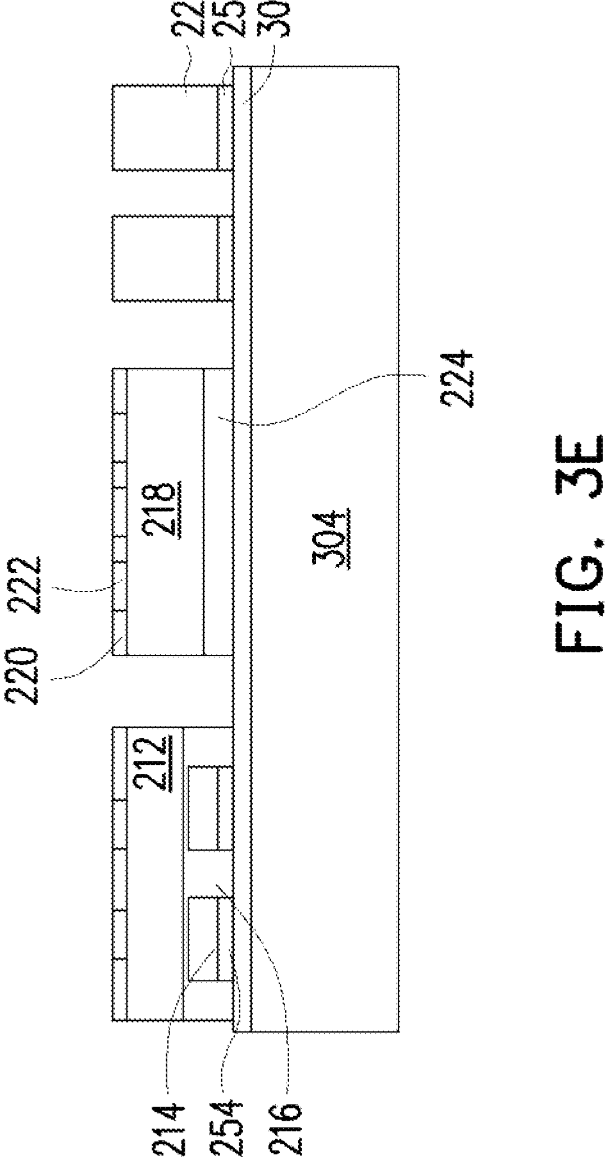

As shown in FIG. 3E, and as part of a series of operations 316, the IC die 212 and the IC die 218 are attached to the release film layer 306. For example, a tool of the die-attach tool set 130 (e.g., the pick-and-place tool, among other examples) may attach the IC die 212 and the IC die 218 to the release film layer 306. In some implementations, a tool of the die-attach tool set 130 (e.g., the pick-and-place tool, among other examples) attaches a diced segment of a flat bonding film material (e.g., the bonding film layer 224) to the IC die 218 prior to attaching the IC die 218 to the release film layer 306. In some implementations, a tool of the die-attach tool set 130 (e.g., the pick-and-place tool among other examples) attaches the diced segment of the flat bonding film material to the release film layer 306 prior to attaching the IC die 218 to the release film layer 306.

Additionally, or alternatively, a tool of the die-attach tool set 130 (e.g., the pick-and-place tool, among other examples) may attach a diced segment of a bonding film (e.g., the bonding film layer 216) to the IC die 212 prior to attaching the IC die 212 to the release film layer 306. In some implementations, a tool of the die-attach tool set 130 (e.g., the pick-and-place tool among other examples) attaches the diced segment of the conformal bonding film material over the pad structure 214 onto the release film layer 306 prior to attaching the IC die 212 to the release film layer 306.

In some implementations, the bonding film layer 216 is heated to an elevated temperature prior to attaching the IC die 212 to the release film layer 306. Additionally, or alternatively, the bonding film layer 224 may be heated at another elevated temperature prior to attaching the IC die 218 to the release film layer 306. To heat the bonding film layer 216 and/or the bonding film layer 224, a tool of the die-attach tool set 130 (e.g., the reflow tool, among other examples) may be used.

In some implementations, viscosities of the bonding film layer 216 and the bonding film layer 224 may vary. For example, a viscosity the bonding film layer 216, during the placing of the IC die 212 over the pad structure 214, is lesser relative to another viscosity of the bonding film layer 224 during the placing of the IC die 218 die on the release film layer 306.

In some implementations, a tool of the encapsulation tool set 135 (e.g., the dispense tool, among other examples), dispenses a viscous, curable bonding material that corresponds to the bonding film layer 216. For example, and in such cases, the dispense tool may dispense the viscous, curable bonding material onto to a surface of the IC die 212 prior to attachment of the IC die 212 to the release film layer 306. Additionally, or alternatively, the dispense tool may dispense the viscous, curable bonding material over the pad structure and onto the release film layer 306 prior to attachment of the IC die 212 to the release film layer 306. In these cases, a curing step at an elevated temperature may be required.

Further, and as shown in FIG. 3E, the layer of polyimide material 220 and the pad structure 222 (e.g., or multiples of the pad structure 222) may be formed on the IC die 212 and/or the IC die 218. For example, and as part of the series of operations 316, a deposition tool of the RDL tool set 105 (e.g., the CVD tool, among other examples) may deposit the layer of polyimide material 220 on the IC die 212 and/or the IC die 218. Additionally, or alternatively and as part of the series of operations 316, tools of the RDL tool set 105 (e.g., the photolithography exposure tool, the photoresist dispense tool, the photoresist develop tool, and/or the dry etch tool, among other examples) may perform patterning and etching operations to form a cavity in the layer of polyimide material 220. Additionally, or alternatively and as part of the series of operations, a deposition tool of the RDL tool set 105 (e.g., the plating tool, among other examples) may deposit a layer of a conductive material (e.g., layer of a copper (Cu) material or a layer of a tungsten (W) material, among other examples) to form the pad structure 222. Additionally, or alternatively and as part of the series of operations 316, a tool of the planarization tool set 110 (e.g., the CMP tool, among other examples) may planarize and/or remove portions of the layer of conductive material.

Figure 3F:
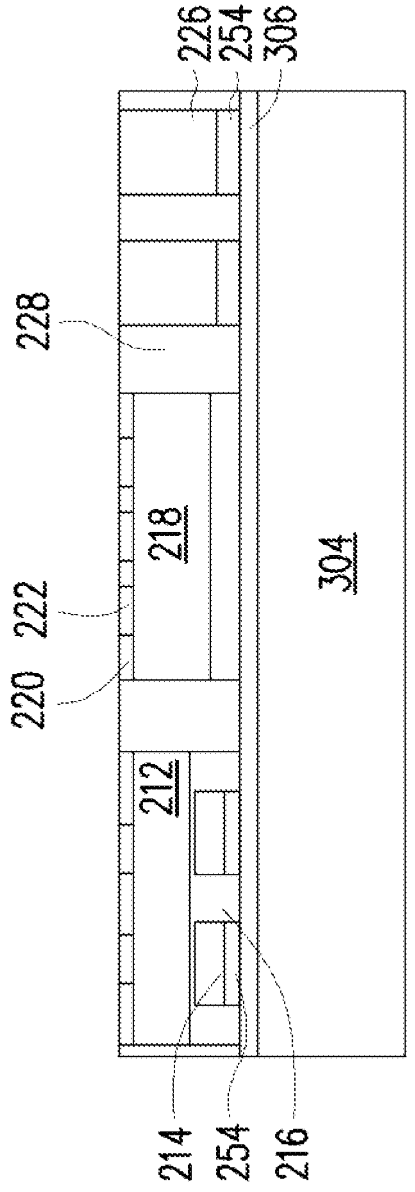

As shown in FIG. 3F, and as part of a series of operations 318, the encapsulation tool set 135 may perform molding operations to encapsulate the IC die 212 and/or the IC die 218 with the mold compound 228. In some implementations and as part of the series of operations 318, a tool of the planarization tool set 110 (e.g., the CMP tool, among other examples) may planarize and/or remove portions of the mold compound 228.

Figure 3G:
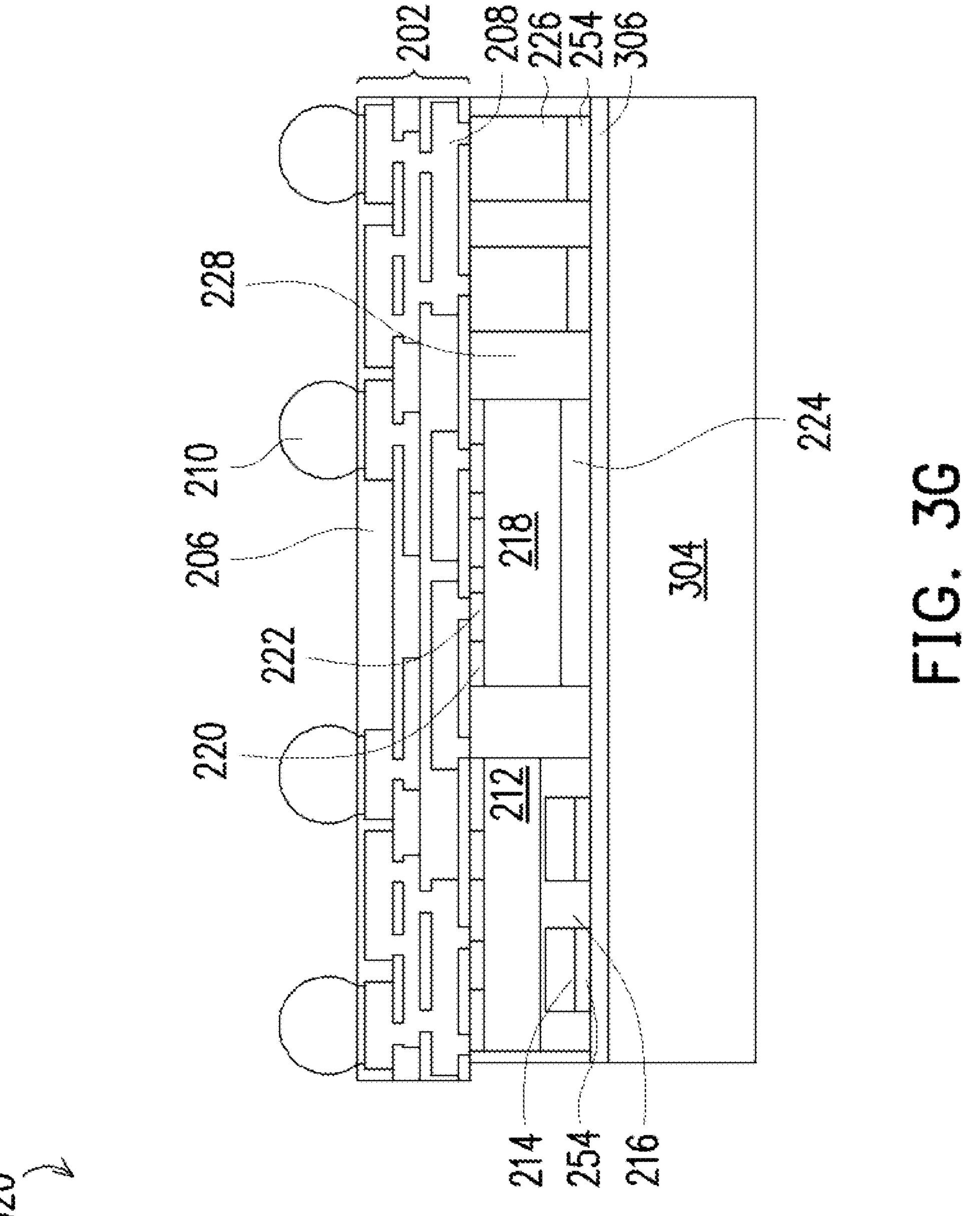

As shown in FIG. 3G, and as part of a series of operations 320, the RDL tool set 105 may form the interconnection structure 202 over the IC die 212 and/or the IC die 218. Additionally, or alternatively and as part of the series of operations 320, the interconnect tool set 115 may form the connection structure 210 (or multiples of the connection structure 210) on pads of the interconnection structure 202.

Figure 3H:
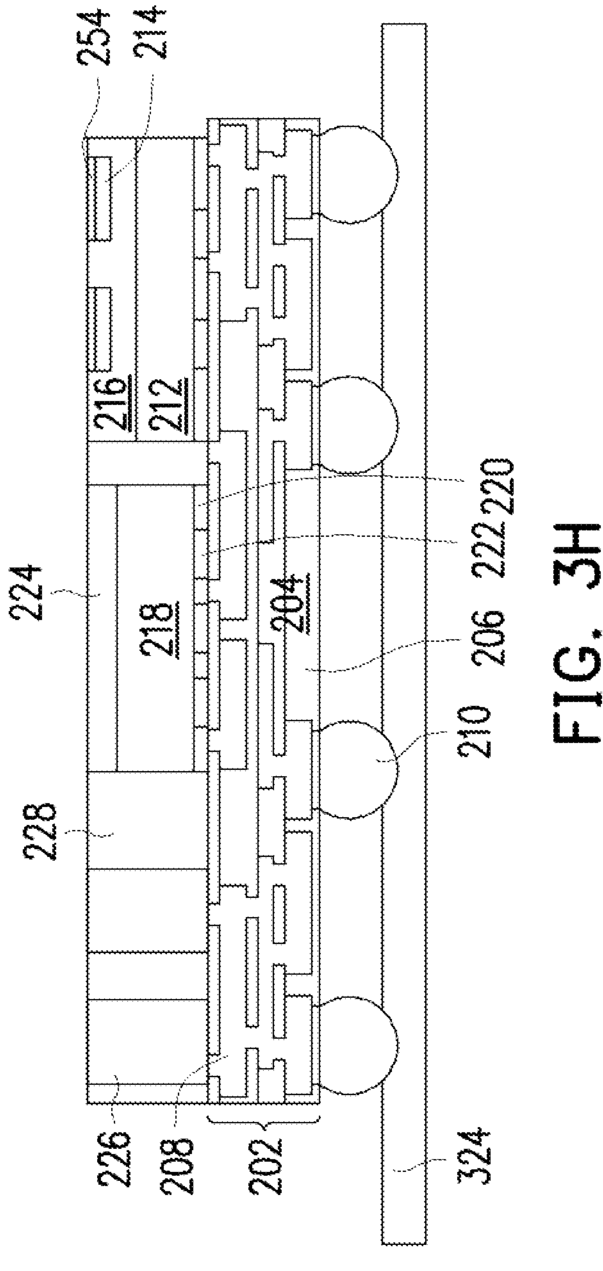

As shown in FIG. 3H and as part of a series of operations 322, the wafer bonding/debonding tool of the RDL tool set 105 may remove the temporary carrier 304 and/or the release film layer 306. In some implementations, one or more operations of the series of operations 322 is performed with the connection structure 210 connecting the interconnect structure 202 and a film-frame carrier 324.

Figure 3I:
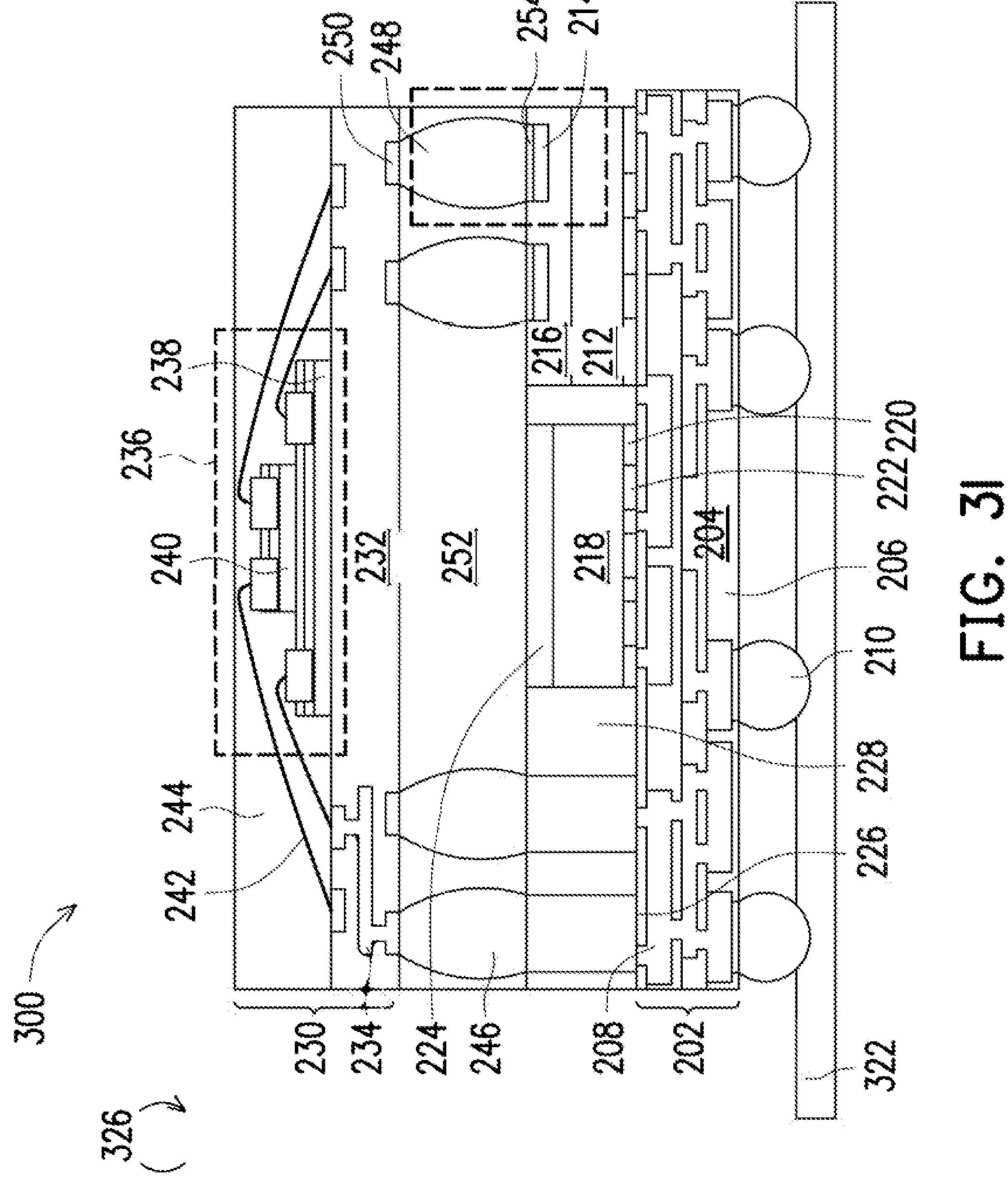

As shown in FIG. 3I and as part of a series of operations 326, A die-attach tool set 130 may attach the semiconductor die package 230 over the interconnection structure 202 using the connection structure 246 and/or the connection structure. In some implementations, one or more operations of the series of operations 326 is performed with the connection structure 210 connecting the interconnect structure 202 and a film-frame carrier 324.

As indicated above, FIGS. 3A-3I are provided as one or more examples. Other examples may differ from what is described with regard to FIGS. 3A-3I. Additionally, or alternatively, there may be additional operations, different operations, or differently arranged operations in the manufacturing process 300 than those shown in FIGS. 3A-3I. Additionally, or alternatively, one or more operations of the manufacturing process 300 may be performed in a semiconductor wafer fabrication facility including one or more tool sets similar to those described in connection with environment 100 of FIG. 1 (e.g., the RDL tool set 105, among other examples).

Figure 4A:
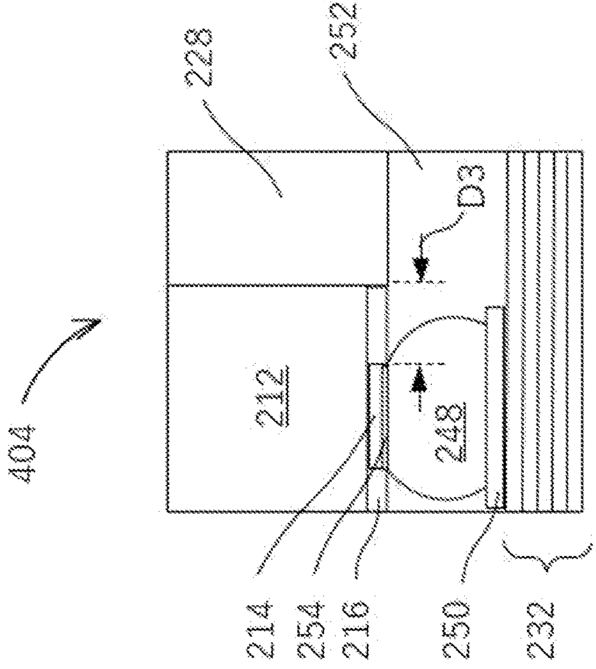
FIGS. 4A-4C are images of example implementations of the semiconductor die package described herein.
Figure 4A:
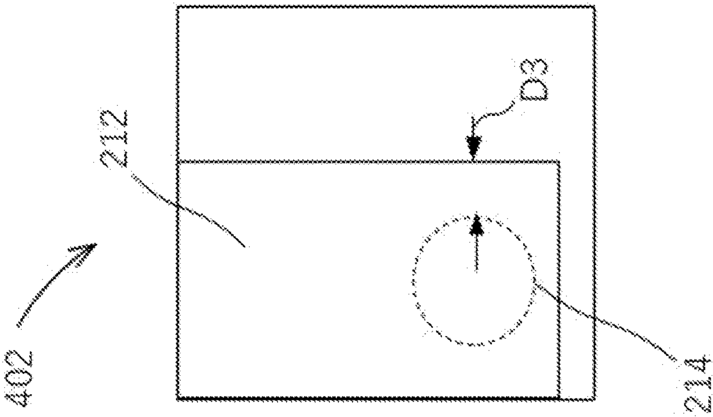
Figure 4A:
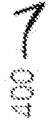
Figure 4B:
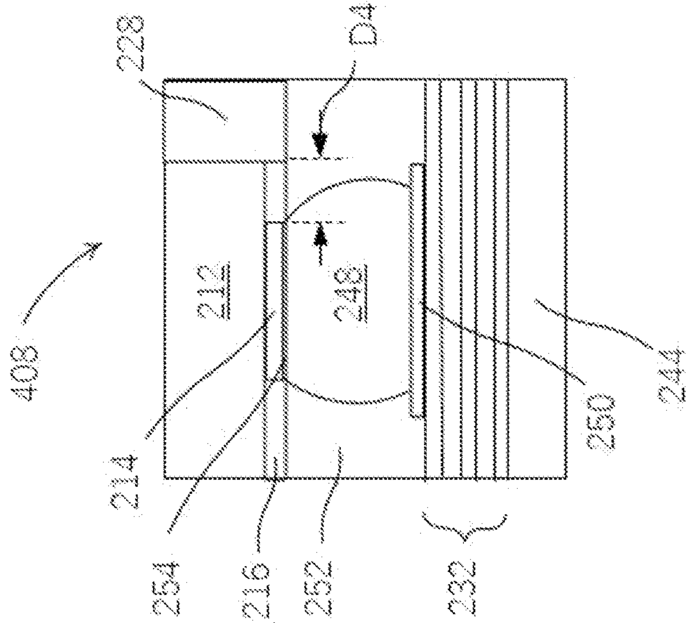
Figure 4B:
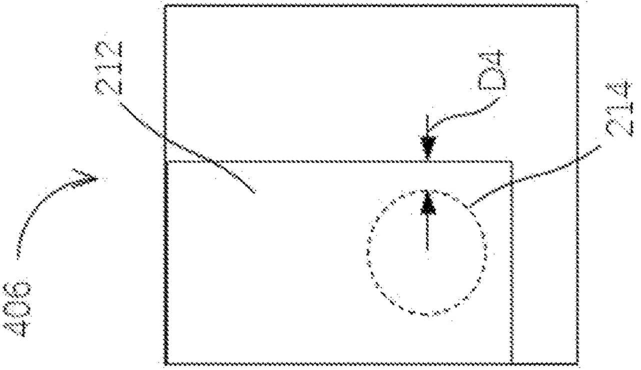
Figure 4B:
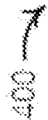
Figure 4C:
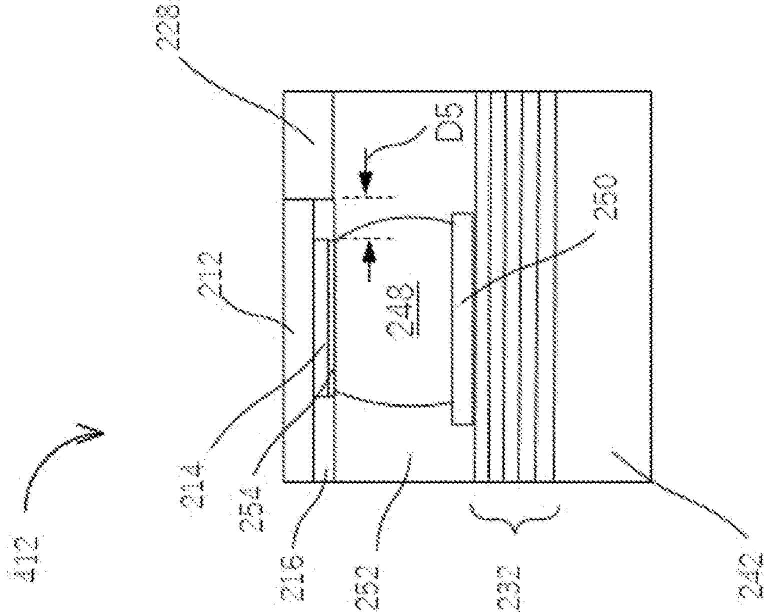
Figure 4C:
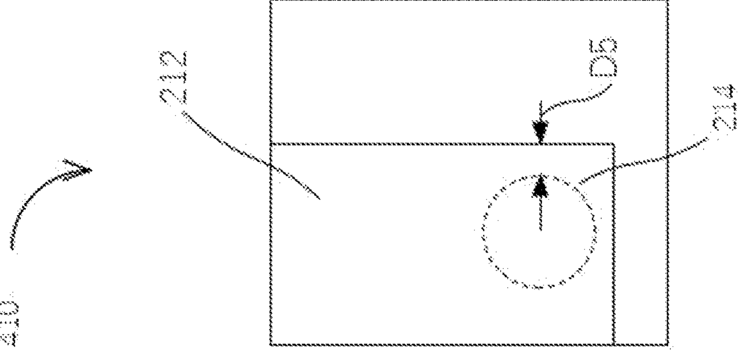
Figure 4C:

FIGS. 4A-4C are images of example implementations 400 of the semiconductor die package 200 described herein. The example implementations 400 include configurations of the pad structure 214 relative to a silicon die edge (SDE) of the IC die 212.

FIG. 4A shows a top view 402 of an example location associated with the pad structure 214 relative an edge of the IC die 212. FIG. 4A further shows a side view 404 of the example location associated with the pad structure 214 relative to the SDE of the IC die 212 including the connection structure 248. In FIG. 4A, the location D3 may be approximately 77.5 μm from the SDE of the IC die 212. In FIG. 4A, the pad structure 214 exhibits no signs of lift off or separation.

The side view 404 of FIG. 4A further shows examples of the mold compound 228, the interconnection structure 232, the pad structure 250, the underfill material 252, and the seed layer 254.

FIG. 4B shows a top view 406 of an example location associated with the pad structure 214 relative an edge of the IC die 212. FIG. 4B further shows a side view 408 of the example location associated with the pad structure 214 relative to the SDE of the IC die 212 including the connection structure 248. In FIG. 4B, the location D4 may be approximately 50 μm from the SDE of the IC die 212. In FIG. 4B, the pad structure 214 exhibits no signs of lift off or separation.

The side view 408 of FIG. 4B further shows examples of the mold compound 228, the interconnection structure 232, the mold compound 244, the pad structure 250, the underfill material 252, and the seed layer 254.

FIG. 4C shows a top view 410 of an example location associated with the pad structure 214 relative an edge of the IC die 212. FIG. 4C further shows a side view 412 of the example location associated with the pad structure 214 relative to the SDE of the IC die 212 including the connection structure 248. In FIG. 4C, the location D5 may be approximately 45 μm from the SDE of the IC die 212. In FIG. 4C, the pad structure 214 exhibits no signs of lift off or separation.

The side view 412 of FIG. 4C further shows examples of the mold compound 228, the interconnection structure 232, the mold compound 244, the pad structure 250, the underfill material 252, and the seed layer 254.

As indicated above, FIGS. 4A-4C are provided as one or more examples. Other examples may differ from what is described with regard to FIGS. 4A-4C.

Figure 5:
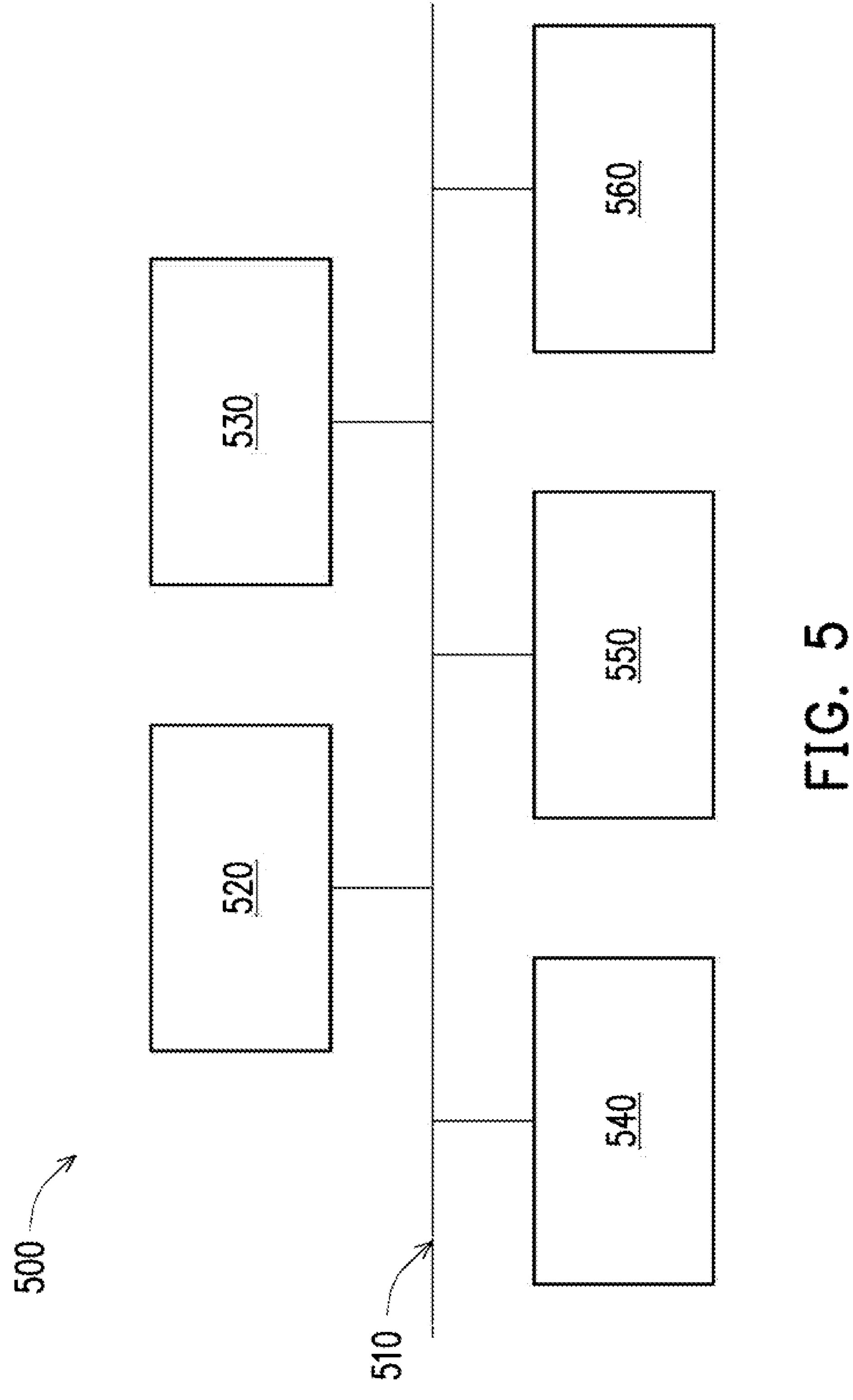
FIG. 5 is a diagram of example components of one or more devices of FIG. 1 described herein.

FIG. 5 is a diagram of example components of a device 500 described herein. In some implementations, one or more of the semiconductor processing tool sets 105-150 and/or the transport tool set 155 may include one or more devices 500 and/or one or more components of device 500. As shown in FIG. 5, device 500 may include a bus 510, a processor 520, a memory 530, an input component 540, an output component 550, and a communication component 560.

Bus 510 may include one or more components that enable wired and/or wireless communication among the components of device 500. Bus 510 may couple together two or more components of FIG. 5, such as via operative coupling, communicative coupling, electronic coupling, and/or electric coupling. Processor 520 may include a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 may include one or more processors capable of being programmed to perform one or more operations or processes described elsewhere herein.

Memory 530 may include volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 may include one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
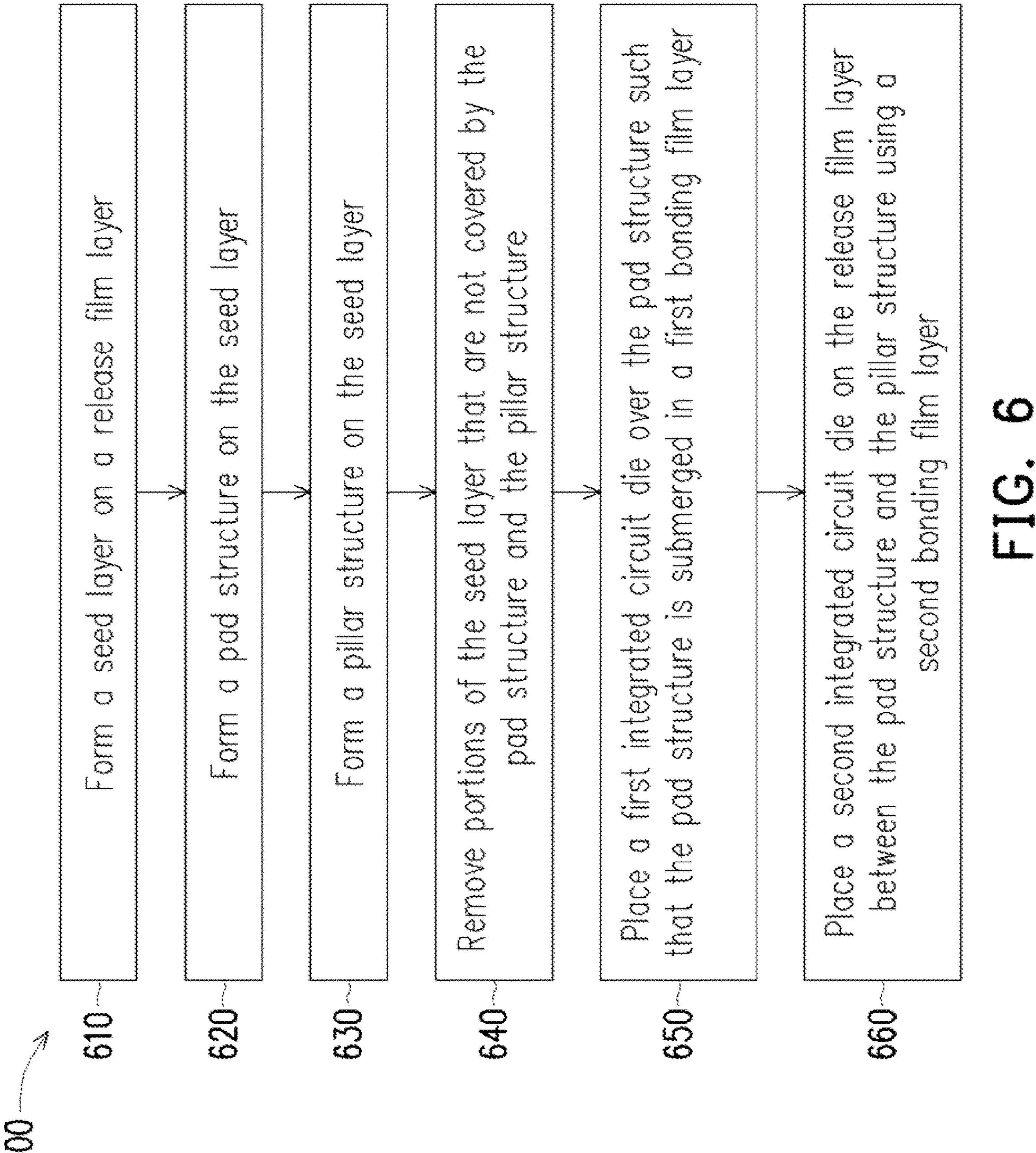
FIG. 6 is a flowchart of an example process associated with fabricating the semiconductor die package described herein.

FIG. 6 is a flowchart of an example process 600 associated with a semiconductor die package and methods of manufacturing. In some implementations, one or more process blocks of FIG. 6 are performed by a one or more of the semiconductor processing tool sets 105-150 described in connection with FIG. 1. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming a seed layer on a release film layer (block 610). For example, one or more tools of the semiconductor processing tool sets 105-150, such as the ALD tool of the RDL tool set 105, among other examples, may form a seed layer 254 on a release film layer 306, as described above.

As further shown in FIG. 6, process 600 may include forming a pad structure on the seed layer (block 620). For example, one or more tools of the semiconductor processing tool sets 105-150, such the plating tool, the photolithography tools, and the dry-etch tool of the RDL tool set 105, may form a pad structure 214 on the seed layer 254, as described above.

As further shown in FIG. 6, process 600 may include forming a pillar structure on the seed layer (block 630). For example, one or more tools of the semiconductor processing tool sets 105-150, such as plating tool, the photolithography tools, and the dry-etch tool of the RDL tool set 105, among other examples, may form a pillar structure (e.g., the connection structure 226) on the seed layer 254, as described above.

As further shown in FIG. 6, process 600 may include removing portions of the seed layer that are not covered by the pad structure and the pillar structure (block 640). For example, one or more tools of the semiconductor processing tool sets 105-150, such as the wet-etch tool of the RDL tool set 105, may remove portions of the seed layer 254 that are not covered by the pad structure 214 and the pillar structure (e.g., the connection structure 226), as described above.

As further shown in FIG. 6, process 600 may include placing a first IC die over the pad structure such that the pad structure is submerged in a first bonding film layer (block 650). For example, one or more tools the semiconductor processing tool sets 105-150, such as the pick-and-place tool of the die-attach tool set 130, among other examples, may place a first IC die (e.g., the IC die 212) over the pad structure 214 such that the pad structure 214 is submerged in a first bonding film layer (e.g., the bonding film layer 216), as described above.

As further shown in FIG. 6, process 600 may include placing a second IC die on the release film layer between the pad structure and the pillar structure using a second bonding film layer (block 660). For example, the one or more tools of the semiconductor processing tool sets 105-150, such as the pick-and-place tool of the die-attach tool set 130, among other examples, may place a second IC die (e.g., the IC die 218) on the release film layer 306 between the pad structure 214 and the pillar structure (e.g., the connection structure 226) using a second bonding film layer (e.g., the bonding film layer 224), as described above.

Process 600 may include additional implementations, such as any single implementation or any combination of implementations described below and/or in connection with one or more other processes described elsewhere herein.

In a first implementation, forming the seed layer 254 on the release film layer 306 includes forming a layer of a titanium-copper material on the release film layer 306, and where forming the pad structure 214 on the seed layer 254 includes plating a layer of copper material on the layer of titanium-copper material, and forming the pad structure 214 from the layer of copper material using a photolithography process.

In a second implementation, alone or in combination with the first implementation, a first viscosity of a first bonding film layer (e.g., the bonding film layer 216), during the placing of the first IC die (e.g., the IC die 212) over the pad structure 214, is lesser relative to a second viscosity of a second bonding film layer (e.g., the bonding film layer 224) during the placing of the second IC die (e.g., the IC die 218) on the release film layer 306.

In a third implementation, alone or in combination with one or more of the first and second implementations, placing the first IC die (e.g., the IC die 212) over the pad structure 214 includes heating the first bonding film layer (e.g., the bonding film layer 216) to an elevated temperature, and placing the first IC die over the pad structure 214 while the first bonding film layer is at the elevated temperature.

In a fourth implementation, alone or in combination with one or more of the first through third implementations, placing the second IC die (e.g., the IC die 218) on the release film layer 306 includes heating the second bonding film layer (e.g., the bonding film layer 224) to an elevated temperature, and placing the second IC die on the release film layer 306 while the second bonding film layer is at the elevated temperature.

In a fifth implementation, alone or in combination with one or more of the first through fourth implementations, process 600 includes forming the first bonding film layer (e.g., the bonding film layer 216) on the first IC die (e.g., the IC die 212) prior to placing the first IC die over the pad structure 214.

In a sixth implementation, alone or in combination with one or more of the first through fifth implementations, forming the first bonding film layer (e.g., the bonding film layer 216) on the first IC die (e.g., the IC die 212) includes dicing a b-stage type of a conformal bonding film into a segment, and placing the segment on the first IC die.

In a seventh implementation, alone or in combination with one or more of the first through sixth implementations, process 600 includes connecting the pillar structure (e.g., the connection structure 226) and a first solder connection (e.g., the connection structure 246), and connecting the pad structure 214 and a second solder connection (e.g., the connection structure 248).

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Some implementations described herein provide techniques and apparatuses for a stacked semiconductor die package. The stacked semiconductor die package may include an upper semiconductor die package above a lower semiconductor die package. The stacked semiconductor die package includes one or more rows of pad structures located within a footprint of an IC die of the lower semiconductor die package. The one or more rows of pad structures may be used to mount the upper semiconductor die package above the lower semiconductor die package. Relative to another stacked semiconductor die package including a row of dummy connection structures adjacent to the IC die that may be used to mount the upper semiconductor die package, a size of the stacked semiconductor die package may be reduced.

In this way, an amount of resources may be reduced when fabricating a volume of the stacked semiconductor die package. For example, an amount of raw materials, an amount of manufacturing tools, and an amount of supporting computing resources may be lesser for a manufacturing line fabricating the stacked semiconductor die package including the one or more rows of pad structures than for a manufacturing line fabricating the stacked semiconductor die package including the one or more rows of dummy connection structures.

As described in greater detail above, some implementations described herein provide a device. The device includes a interconnection structure including a redistribution layer structure including a first electrically conductive trace. The device includes an IC die above the first interconnection structure. The device includes a first pad structure above a top surface of the IC die. The device includes a bonding film layer between the first pad structure and the top surface of the IC die, where the bonding film layer electrically insulates the first pad structure from the IC die. The device includes a first connection structure adjacent to an edge of the IC die, where the first connection structure connects to the first electrically conductive trace. The device includes a semiconductor die package above the first interconnection structure. The semiconductor die package includes a second interconnection structure. The second interconnection structure includes a second electrically conductive trace, where the second electrically conductive trace connects to the first electrically conductive trace through the first connection structure. The semiconductor die package includes a second pad structure connected to the first pad structure through a second connection structure.

As described in greater detail above, some implementations described herein provide a semiconductor die package. The semiconductor die package includes a lower substrate. The semiconductor die package includes a first IC die connected to the lower substrate. The semiconductor die package includes a second IC die connected to the lower substrate adjacent to the first IC die. The semiconductor die package includes an upper substrate above the first IC die and above the second IC die. The semiconductor die package includes a first connection structure outside a first top-view perimeter of the first IC die, outside a second top-view perimeter of the second IC die, and inside a third top-view perimeter of the lower substrate, where the first connection structure is between electrically conductive traces of the lower substrate and electrically conductive traces of the upper substrate. The semiconductor die package includes a second connection structure inside the second top-view perimeter of the second IC die, inside the third top-view perimeter of the lower substrate, and outside the first top-view perimeter of the first IC die, where the second connection structure is between a row of electrically-isolated pad structures above an upper surface of the second IC die and pad structures of the upper substrate.

As described in greater detail above, some implementations described herein provide a method. The method includes forming a seed layer on a release film layer. The method includes forming a pad structure on the seed layer. The method includes forming a pillar structure on the seed layer. The method includes removing portions of the seed layer that are not covered by the pad structure and the pillar structure. The method includes placing a first IC die over the pad structure such that the pad structure is submerged in a conformal bonding film layer. The method includes placing a second IC die on the release film layer between the pad structure and the pillar structure using a bonding film layer.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a seed layer on a release film layer;

forming a pad structure on the seed layer;

forming a pillar structure on the seed layer;

removing portions of the seed layer that are not covered by the pad structure and the pillar structure;

placing a first integrated circuit die over the pad structure such that the pad structure is submerged in a first bonding film layer; and placing a second integrated circuit die over the release film layer between the pad structure and the pillar structure using a second bonding film layer.

2. The method of claim 1, wherein forming the seed layer on the release film layer comprises:

forming a layer of a titanium-copper material on the release film layer, and wherein forming the pad structure on the seed layer comprises:

plating a layer of copper material on the layer of titanium-copper material, and forming the pad structure from the layer of copper material using a photolithography process.

3. The method of claim 1, wherein a first viscosity of the first bonding film layer, during the placing of the first integrated circuit die over the pad structure, is lesser relative to a second viscosity of the second bonding film layer during the placing of the second integrated circuit die on the release film layer.

4. The method of claim 1, wherein placing the first integrated circuit die over the pad structure comprises:

heating the first bonding film layer to an elevated temperature; and placing the first integrated circuit die over the pad structure while the first bonding film layer is at the elevated temperature.

5. The method of claim 1, wherein placing the second integrated circuit die on the release film layer comprises:

heating the second bonding film layer to an elevated temperature; and placing the second integrated circuit die on the release film layer while the second bonding film layer is at the elevated temperature.

6. The method of claim 1, further comprising:

connecting the pillar structure and a first solder connection structure; and connecting the pad structure and a second solder connection structure.

7. The method of claim 1, further comprising:

forming the first bonding film layer on the first integrated circuit die prior to placing the first integrated circuit die over the pad structure.

8. The method of claim 7, wherein forming the first bonding film layer on the first integrated circuit die comprises:

dicing a b-stage type of a conformal bonding film into a segment; and placing the segment on the first integrated circuit die.

9. A method, comprising:

forming a first pad structure on a first portion of a seed layer;

forming a connection structure on a second portion of the seed layer, wherein the second portion of the seed layer is laterally spaced from the first portion of the seed layer;

forming a first integrated circuit die over the first pad structure; and forming a second integrated circuit die between the first pad structure and the connection structure, wherein the second integrated circuit die is laterally spaced from the connection structure and the first integrated circuit die.

10. The method of claim 9, wherein a height of the connection structure is greater than a height of the first pad structure.

11. The method of claim 9, a width of the first pad structure is in a range of approximately 50 μm to approximately 300 μm.

12. The method of claim 9, further comprising:

forming, over at least one of the first integrated circuit die and the second integrated circuit die, at least one of a layer of polyimide material and a second pad structure.

13. The method of claim 9, further comprising:

forming a mold compound surrounding the connection structure, the first integrated circuit die, and the second integrated circuit die.

14. The method of claim 13, wherein the mold compound comprises at least a first portion, between the first integrated circuit and the second integrated circuit, and a second portion, between the second integrated circuit and the connection structure.

15. The method of claim 9, further comprising:

forming an interconnection structure over the connection structure, the first integrated circuit die, and the second integrated circuit die; and forming one or more connection structures on the interconnection structure.

16. A method, comprising:

forming a mold component comprising:

a first pad structure, a first connection structure, wherein the first connection structure is laterally spaced from the first pad structure, and wherein the first connection structure resides on a same horizontal plane as the first pad structure, a first integrated circuit die over the first pad structure;

a second integrated circuit die between the first pad structure and the first connection structure, wherein the second integrated circuit die is laterally spaced from the first connection structure and the first integrated circuit die;

forming a first interconnection structure over the mold component; and forming one or more connection components on the first interconnection structure.

17. The method of claim 16, further comprising:

forming an underfill material over the mold component, wherein the underfill material and the first interconnection structure are formed over opposing sides of the mold component.

18. The method of claim 17, further comprising:

forming a second interconnection structure over the underfill material, wherein the second interconnection structure comprises an electrically conductive trace.

19. The method of claim 18, wherein the second interconnection structure further comprises a second connection structure connecting the first connection structure to the electrically conductive trace.

20. The method of claim 19, further comprising:

one or more of:

a third die, over the second interconnection structure, connected to the electrically conductive trace, or a fourth die, over the second interconnection structure, connected to a pad structure in the second interconnection structure.

* * * * *